United States Patent [19]

Olson

[11] Patent Number: 4,633,051
[45] Date of Patent: Dec. 30, 1986

[54] STABLE CONDUCTIVE ELEMENTS FOR DIRECT EXPOSURE TO REACTIVE ENVIRONMENTS

[75] Inventor: Donald M. Olson, Scottsdale, Ariz.

[73] Assignee: Advanced Semiconductor Materials America, Inc., Phoenix, Ariz.

[21] Appl. No.: 554,978

[22] Filed: Nov. 23, 1983

[51] Int. Cl.$^4$ .............................................. H05B 6/10
[52] U.S. Cl. .......................... 219/10.49 R; 219/10.43; 219/10.53; 219/10.67; 118/50.1; 118/620; 118/725; 118/728
[58] Field of Search ..................... 219/10.49 R, 10.67, 219/10.53, 10.41, 10.43, 10.55 R, 10.55 F; 118/723-728, 50.1, 620; 425/45.1

[56] References Cited

U.S. PATENT DOCUMENTS

| | | | |
|---|---|---|---|
| 3,848,038 | 11/1974 | Dench | 219/10.55 X |
| 3,923,580 | 12/1975 | Leatherman | 219/10.53 X |
| 4,035,547 | 7/1977 | Heller, Jr. et al. | 219/10.53 |
| 4,168,998 | 9/1979 | Hasegawa et al. | 219/10.49 R |
| 4,401,507 | 8/1983 | Engle | 118/723 X |
| 4,424,096 | 1/1984 | Kumagai | 118/620 X |

Primary Examiner—Philip H. Leung
Attorney, Agent, or Firm—Harry M. Weiss & Associates

[57] ABSTRACT

Improved conductive elements for direct exposure to reactive ambients. The conductive articles are fabricated from bodies of alpha silicon carbide comprising a minor fraction of homogeneously dispersed conductive particles. The bodies may have a sufficiently low electrical resistivity so that they may be used as heaters for direct contact with workpieces at high temperatures.

13 Claims, 2 Drawing Figures

STABLE CONDUCTIVE ELEMENTS FOR DIRECT EXPOSURE TO REACTIVE ENVIRONMENTS

BACKGROUND OF THE INVENTION

1. Field of the Invention

This invention relates generally to stable conductive elements and more specifically to stable conductive elements which resist chemical reactions and which are substantially impervious to passage of gases at elevated temperatures.

2. Description of the Prior Art

In the past, various compositions have been used for conductive elements for direct exposure to reactive agents over a range of temperatures. In general, such elements comprised mixtures or compounds including metals and semiconductors which would either degrade substantially on exposure to reaction gases at high temperatures or were so porous that undesired gases could cause contamination by passage through or entrapment in the heating element. Thus in general such conductive elements have had to be separated from the working space of the furnace or reaction chamber by a non-porous non-reactive coating or by a tube or other enclosure to separate the conductive means from the working space. Yet another problem exists with conductive elements exposed directly to reactants in that eventually cleaning or etching is required to eliminate build up of reaction products, for example by chemical etching. Inability of the conductive element to withstand the cleaning method would lead to its premature destruction. For example, it is known to use R.F. heated susceptors fabricated from graphite, which is both reactive and permeable. To isolate such a susceptor from the reacton ambient, it is known to provide a coating such as silicon carbide. Such a coating is easily damaged, and tends to crack due to thermal excursions. Similarly, where freedom from unwanted reactants is required in a furnace, the workpieces must be isolated from heating elements, such as resistance wires or silicon carbide resistance elements, by a furnace tube constructed, for example, from quartz or alumina, which are expensive, prone to breakage, difficult to clean, and introduce undesirable thermal resistance between the heating elements and the workpieces.

Thus, a need existed to provide more inert, less pervious, and stronger conductive elements which could be in direct contact with the working space. In the case of a heated chamber, a need existed to provide a heating element which also serves to isolate the working space from ambient reactants.

SUMMARY OF THE INVENTION

In accordance with one embodiment of this invention it is an object thereof to provide an improved refractory conductive element for elevated temperature processes.

It is another object of this invention to provide an improved refractory conductive element for direct exposure to the working space in a reactive environment.

It is still another object of this invention to provide an impervious, refractory conductive element with sufficient electrical resistance to permit direct or indirect electrical excitation.

It is yet a further object of this invention to provide a unitary conductive element and enclosure which is sufficiently inert and impervious to allow high-purity high-temperature processing.

It is yet another object of this invention to provide an electrically-excited conductive element which may be subject to repeated chemical cleaning processes without substantial degradation.

BRIEF DESCRIPTION OF THE PREFERRED EMBODIMENTS

In accordance with one embodiment of this invention, there is disclosed a conductive element comprising alpha silicon carbide containing a small percentage of a conductive material in a homogeneous body whose electrical resistivity is below about one ohm-centimeter. The conductive adulterant, which may comprise for example, graphite, molybdenum, or tungsten, lowers the resistivity of the body to permit direct electrical excitation without significantly enhancing the gas permeability or chemical reactivity of the alpha silicon carbide. In the form of a plate, such a composition may be used as a susceptor in an R.F. heated reaction chamber.

In acordance with another embodiment of this invention, a refractive material comprising alpha silicon carbide containing a small percentage of a conductive material to lower the electrical resistivity to below about one ohm-centimeter may be formed into a unitary heating element-reaction chamber which is substantially impervious to ambient gases and which is highly resistant to corrosive chemical cleaning.

The foregoing and other objects, features, and advantages of the invention will be apparent from the following more particular description of the preferred embodiments of the invention, as illustrated in the accompanying drawings.

THE SPECIFICATION

Figure 1:
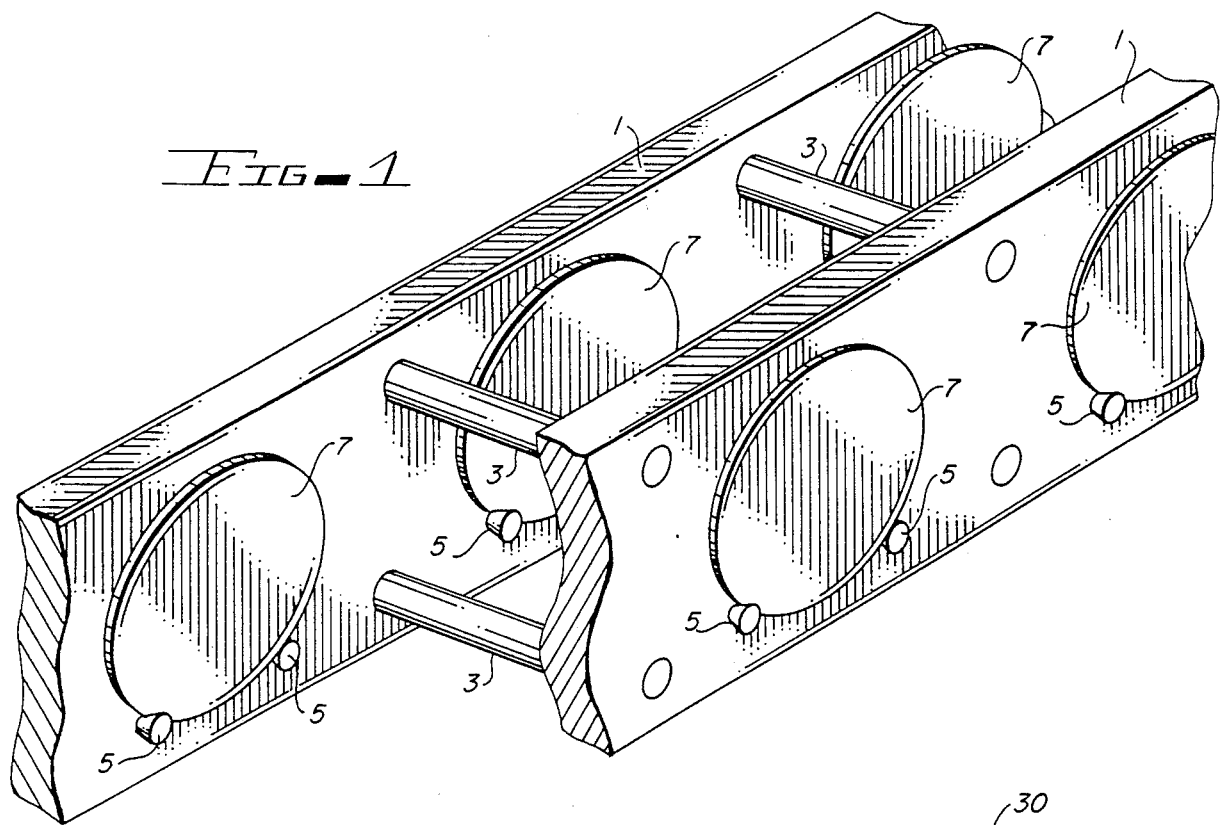
FIG. 1 is illustrative of a conductive element for use in a chemical vapor deposition apparatus according to the present invention.

According to a known process, particles of alpha-silicon carbide may be produced in a high temperature reaction. These particles range in size from about seven to about ten microns. Solid articles may be formed from such particles by compressing them into roughly the desired shape and then sintering the compressed mass at around 1800 deg. C. whereby the particles are coalesced by solid-state sintering to form a dense impermeable body comprising substantially pure alpha-silicon carbide. Upon sintering, there is an approximately 18% linear shrinkage of the material. The electrical resistivity of the resulting article is both high and variable. Thus the objects fabricated are not particularly suitable as conductive elements, as the resistances are too high.

It is also known to make electrical heaters comprising silicon carbide by combining particles of beta-silicon carbide and carbon (such as carbon black) and reaction-sintering the mass in the presence of a vapor to produce a material with a relatively low electrical resistivity. The material generally comprises an excess of free silicon in addition to the compounded silicon carbide. The unreacted free silicon is highly undersirable where the element is to be subjected to reactive ambients at high temperature, or to corrosive chemical cleaning at room temperature, because of degradation of the mechanical properties of the article.

According to the present invention, the foregoing and other shortcomings of known conductive elements for direct exposure to reactive ambients may be overcome by fabricating such elements from a material comprising alpha silicon carbide including a minor fraction of homogeneously dispersed conductive particles to lower the electrical resistivity without substantially increasing the gas permeability (porosity) or chemical reactivity of the material. Alpha silicon carbide particles preferably in the size range from about seven to about ten microns are mixed with smaller conductive particles and sintered in the range of 1800° C. The use of conductive particles of less than about six micron particle size is preferable. The conductive particles should have a high melting point, low chemical reactivity, and a coefficient of termal expansion not too dissimilar to alpha silicon carbide. Low resistivities of the adulterants suitable for the conductive particles which preferably include one or more of graphite, tungsten, and molybdenum.

As an example, a five percent mixture of graphite in alpha silicon carbide yielded a finished material with a resistivity of about one ohm-centimeter, while ten percent graphite resulted in about 0.1 ohm-centimeter. Any carbon particles which remain at the surface of the finished conductive object may be removed by oxidation at elevated temperature.

Conductive articles with reasonable dimensional tolerances may be provided by pressing the mixture of alpha silicon carbide and the conductive particles into the desired shape, allowing for a roughly 18% linear shrinkage during the sintering cycle. Electrical discharge machining of the sintered object may be used to refine the shape.

Referring now to FIG. 1, there is illllustrated an example of conductive assembly as a preferred embodiment according to the present invention. The apparatus shown is suitable for use in a high-temperature plasma-enhanced chemical vapor deposition apparatus, described in more detail for example in U.S. Pat. No. 4,401,507, issued to George M. Engle on Aug. 30, 1983. Plates 1 are made from the material described hereinbefore and serve as conductive electrodes to maintain a plasma discharge in the space between the plates. Spacers 3 serve to insulate the plates 1 and may be made from unadulterated (a dielectric) alpha silicon carbide so they may be press fitted into holes in the plates 1. The workpieces 7 may comprise, for example, discs of semiconductors to be coated. The workpieces 7 are held in place against the boat plates 1 by tapered pegs 5, which again are preferably made of the conductive silicon carbide herein before described. When the resistivity of the material of the plates is below about one ohm-centimeter, R.F. energy may be inductively coupled to heat the workpieces in the case, for example, of a thermally-activated chemical vapor deposition system. In either case, the plate or plates are exposed to reactive gases at elevated temperatures, and become coated with the deposition products, which must be periodically removed, as by chemical etching. The articles made of the described composition are not substantially attacked by the etching, and are also not penetrated to any significant degree by the etch, so that extensive high-temperature outgassing is not required to purge the conductive objects.

Figure 2:
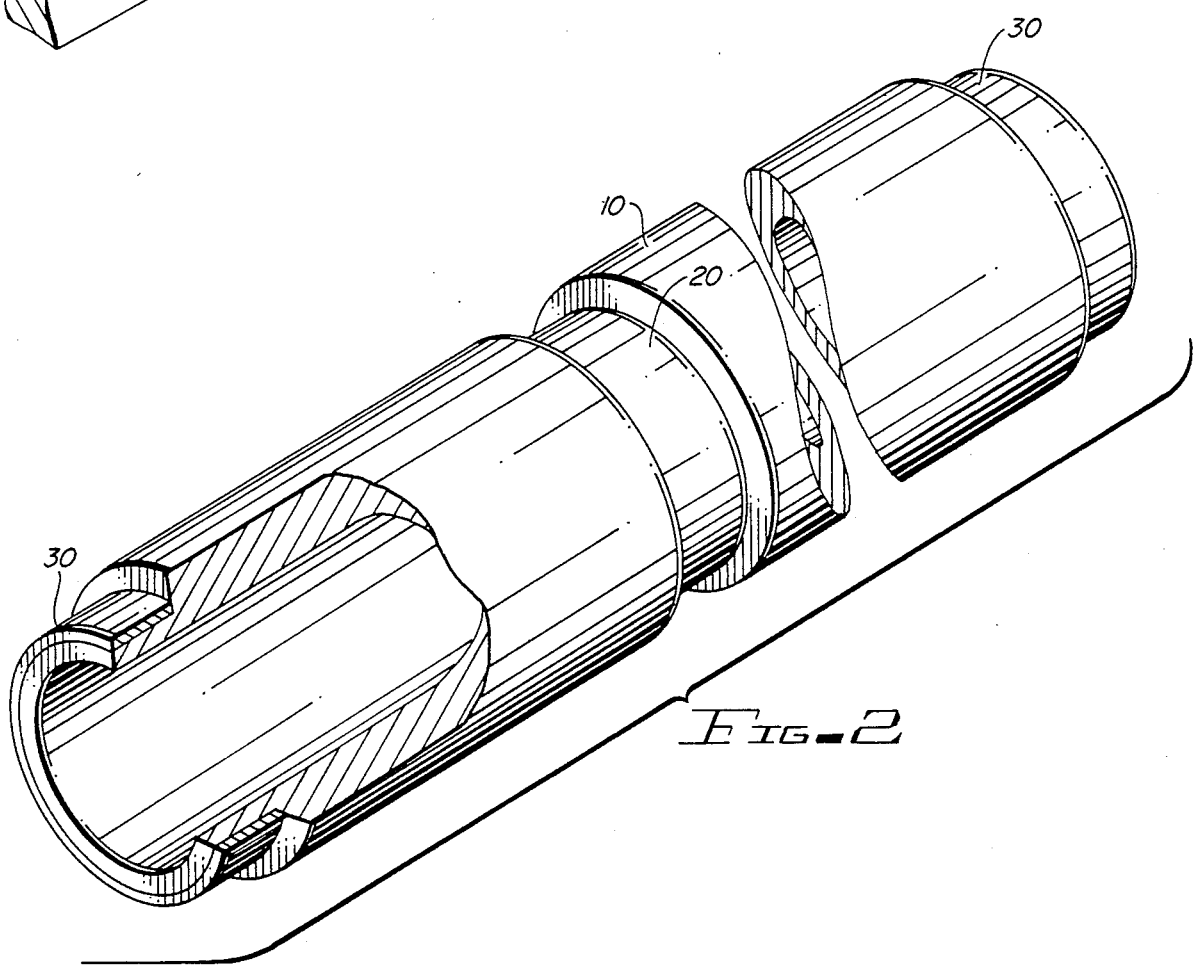
FIG. 2 is a partially cut-away cross-sectional view of a resistance heated environmental chamber according to the present invention.

As another example of a preferred embodiment of the present invention, FIG. 2 illustrates a processing chamber comprised of the conductive refractory material hereinbefore described. In this Figure, element 10 is a tube formed from the alpha silicon carbide comprising a minor fraction of homogeneously dispersed conductive particles of the preferable type disclosed above. Annular recessed conductive contacts 20 (only one is shown) serve as electrodes for the application of an electric current to heat the central portion of the tube 10. Similar end annular recessed regions 30 serve as a surface for the application of one or more end caps (not shown) which permit loading and sealing of the processing chamber. Both sets of preferably recessed annular regions 20 and 30 which are first formed in a preferably recessed configuration are then electroless nickel or copper coated. The result is a unitary processing chamber which serves both as a heating element and as a refractory enclosure for elevated temperature processes in reactive environments. An appropriately modified container could be used, for example, as a self-heated crucible for a crystal-pulling apparatus such as for pulling a semiconductor crystal from a semiconductor melt.

While this invention has been particularly shown and described with reference to preferred embodiments thereof, it will be understood by those skilled in the art that the foregoing and other changes in form and details may be made without departing form the spirit and scope of the invention.

I claim:

1. A conductive apparatus capable of being heated by R.F. energy or by direct coupling to a source of electrical energy while being exposed to reactive environments comprising a body of alpha silicon carbide, said body also comprising a minor fraction of homgeneously-dispersed conductive particle means for controlling the electrical conductivity of said body without substantially increasing the porosity of said body.

2. The conductive apparatus of claim 1 wherein said conductive particle means are particles selected from at least one of the materials of the group consisting of graphite, molybdenum, and tungsten.

3. The conductive apparatus of claim 1 wherein the electrical resistivity of said body is less than about one ohm-centimeter.

4. The conductive apparatus of claim 1 wherein said body is heated by R.F. energy.

5. The conductive apparatus of claim 1 wherein said body is heated by direct coupling to a source of electrical energy.

6. A conductive plate for sustaining a plasma discharge in a chemical vapor deposition apparatus, said plate comprising a body of alpha silicon carbide, said body further comprising a minor fraction of homogenously-dispersed conductive particle means to control the electrical conductivity of said body without substantially increasing its porosity.

7. The conductive plate of claim 6 wherein said conductive particle means are particles selected from at least one of the materials of the group consisting of graphite, molybdenum, and tungsten.

8. An R.F. heated susceptor for use in a chemical vapor deposition process, said susceptor comprising a body of alpha silicon carbide, said body further comprising a minor fraction of homogeneously-dispersed conductive particle means to control the electrical conductivity of said body without substantially increasing its porosity.

9. The R.F. heated susceptor of claim 8 wherein said conductive particle means are particles selected from at least one of the materials of the group consisting of graphite, molybdenum, and tungsten.

10. A substantially impervious-to-gases resistance-heated processing chamber, said chamber comprising a body of alpha silicon carbide, said body further comprising a minor fraction of homogeneously-dispersed conductive particle means to control the electrical conductivity of said body without substantially increasing its porosity.

11. The processing chamber of claim 10 wherein said conductive particle means are particles selected from at least one of the materials of the group consisting of graphite, molybdenum, and tungsten.

12. A method of fabricating a conductive element for direct exposure to reactive environments, comprising homogeneously dispersing a minor fraction of an electrically conductive material in a body of alpha silicon carbide to reduce the electrical resistivity of said body.

13. The method of claim 12 wherein said minor fraction of an electrically conductive material comprising particles selected from at least one of the materials of the group consisting of graphite, molybdenum, and tungsten.

* * * * *